United States Patent [19]

Roberts et al.

[11] Patent Number: 5,047,726

[45] Date of Patent: Sep. 10, 1991

[54] METHOD AND APPARATUS FOR IMPLEMENTING FOUR-FREQUENCY MEASURING PROCESS FOR COUPLED-DUAL RESONATOR CRYSTALS USING BOTH RESONATOR PORTS

[75] Inventors: Gerald Roberts, Lynchburg; Samual Toliver, Rustburg; John U. Daniels, Jr., Lynchberg, all of Va.

[73] Assignee: Ericsson GE Mobile Communications Inc., Lynchburg, Va.

[21] Appl. No.: 480,774

[22] Filed: Feb. 16, 1990

[51] Int. Cl.$^5$ ............................................ G01R 29/22
[52] U.S. Cl. .................................. 324/727; 324/652; 324/649
[58] Field of Search ............... 324/727, 652, 653, 682, 324/719, 80, 81, 649; 29/25.35

[56] References Cited

U.S. PATENT DOCUMENTS

| | | | |
|---|---|---|---|
| 3,697,903 | 10/1972 | Sauerland | 333/72 |
| 3,832,631 | 8/1974 | Koga et al. | 324/727 |
| 3,840,804 | 10/1974 | Sauerland | 324/727 |
| 3,963,982 | 6/1976 | Roberts | 324/727 |
| 4,093,914 | 6/1978 | Peppiatt et al. | 324/727 |
| 4,112,134 | 9/1978 | Buynak et al. | 427/10 |
| 4,447,782 | 5/1984 | Rutkoski | 324/727 |
| 4,578,634 | 3/1986 | Healey, III et al. | 324/727 |
| 4,725,771 | 2/1988 | Sauerland | 324/727 |
| 4,733,164 | 3/1988 | Sauerland | 324/727 |
| 4,782,281 | 11/1988 | Williamson | 324/727 |

OTHER PUBLICATIONS

G. E. Roberts, Proc. 33rd Ann. Symp. on Freq. Contr., "A Four-Frequency Process for Accurately Measuring Coupled-Dual Resonator Crytal", May, 1979, pp. 159-165.

G. E. Roberts, IEEE Trans. on Ultrasonics, Ferroelectrics, & Freq. Control, "The Four-Frequency Process for Coupled Duals Using Error-Corrected S-Parameter Measurements", vol. 35, No. 3, May, 1988, pp. 306-314.

Primary Examiner—Kenneth Wieder
Assistant Examiner—Jack B. Harvey
Attorney, Agent, or Firm—Nixon & Vanderhye

[57] ABSTRACT

A third case or manner of obtaining the four critical frequencies useful in accurately measuring coupled-dual resonator crystals, wherein both ports of the crystal structure are monitored, rather than a single port in the previously known cases. Here the B port, for example, is monitored with the A-side open-circuited or with a capacitor in parallel with it, and the A port is monitored with the B-side short-circuited.

15 Claims, 4 Drawing Sheets

FIG. 1
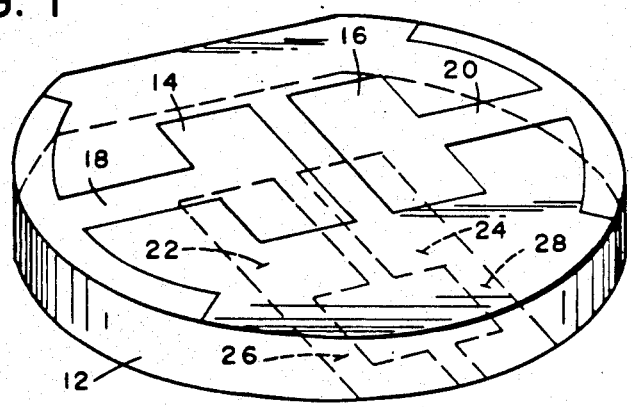
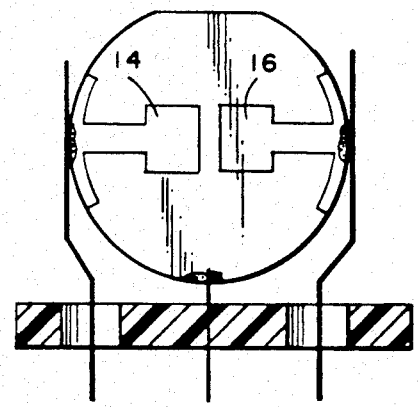
FIG. 2A
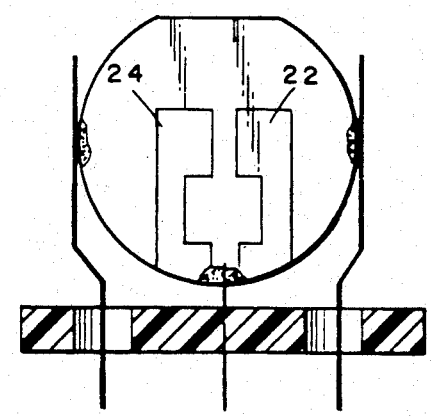
FIG. 2B

METHOD AND APPARATUS FOR IMPLEMENTING FOUR-FREQUENCY MEASURING PROCESS FOR COUPLED-DUAL RESONATOR CRYSTALS USING BOTH RESONATOR PORTS

CROSS-REFERENCE TO RELATED APPLICATION

The subject application is related to the following copending commonly-assigned U.S. patent application filed concurrently herewith: U.S. Ser. No. 07/480,773 entitled "ACCURATELY MEASURING HIGH FREQUENCY COUPLED-DUAL RESONATOR CRYSTALS".

BACKGROUND AND SUMMARY OF THE INVENTION

This application is generally related to monolithic coupled-dual resonator crystals and in particular is directed to an improved four frequency measuring process which is useful in accurately measuring three important crystal parameters such as the two resonator frequencies and the synchronous peak separation frequency at any step in the crystal fabrication process after the resonators are formed and up to and including the final test operation.

A typical coupled-dual resonator crystal includes a plate of piezoelectric material having an input electrode and output electrode on one face of the plate and a common electrode on the opposite face of the plate with a first resonator formed by the input electrode and common electrode, and a second resonator formed by the output and common electrodes. Such dual resonator crystal filters are used extensively in electronic applications including IF filters for mobile and cellular radios, for example. Although such devices are mass produced using automated techniques, control of parameters such as electrode locations, thicknesses and spacings are critical, particularly where high center frequencies are required. Such manufacturing techniques require real time accurate measurements of key coupled-dual crystal filter characteristics during the fabrication process as well as at the final test operation.

As indicated in commonly assigned U.S. Pat. No. 4,093,914 to Peppiatt and Roberts, accurate determination of key characteristics such as the resonant frequency of each of the dual resonators is desirable. Moreover, determination of "synchronous peak separation frequency" (SPSF) is indicated to be of particular significance since it provides a common reference value at a particular point in a process of manufacturing a specific crystal design such that each crystal in the group may be properly evaluated by being mathematically related to standard conditions. These key crystal parameters including synchronous peak separation frequency are calculated based upon four critical frequencies determined by either of two disclosed methods. Both of the disclosed methods involve obtaining four critical frequencies by monitoring one of the two crystal ports while either shorting or effectively open circuiting the second port.

Although the processes disclosed in this commonly assigned patent offer the advantage o requiring the monitoring of only a single port, we have discovered an additional process for obtaining a new set of four critical frequencies which can be used in the calculation of the noted key crystal parameters where both ports must be monitored while producing similar accurate and consistent results.

In brief summary, we have discovered that two of the above noted critical frequencies may be obtained by monitoring a first port of a high frequency monolithic crystal filter with the second port open circuited or with a capacitor connected in parallel therein; whereas, the second two critical frequencies may be obtained by monitoring the opposite or second port with the first port short circuited. Although the latter two frequencies obtained are basically the same as those taught in the aforementioned commonly assigned patent, the first two frequencies measured may be somewhat different than those previously obtained and usually are different unless the coupled-dual crystal is symmetrical, which is not generally the case. Nevertheless, the frequencies obtained would produce correct calculated results for the above noted key crystal parameters in accordance with contemporary measuring standards. Such contemporary measuring standards are discussed in "The four-frequency process for coupled duals using error-corrected S-parameter measurements", by G. E. Roberts, *IEEE Trans. on Ultrasonics, Ferroelectrics, & Frequency Control*, Vol. 35, No. 3, May 1988, pp. 306–314. Furthermore, since our process can be implemented in a convenient and practical manner using the illustrated structure or known vector network analyzers while producing the noted advantages, substantial improvements in crystal measurements throughout the crystal manufacturing process are possible.

BRIEF DESCRIPTION OF THE DRAWINGS

These as well as other objects and advantages of this invention will be more completely appreciated by carefully studying the following detailed description of a presently preferred exemplary embodiment of this invention in conjunction with the accompanying drawings of which:

FIG. 1 is a perspective view of a coupled-dual resonator crystal;

FIGS. 2A and 2B show the active and ground sides of a mounted crystal;

DETAILED DESCRIPTION OF THE DRAWINGS

Figure 3:
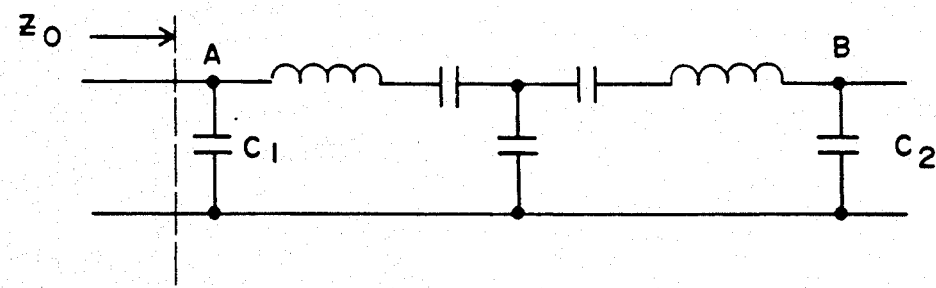
FIG. 3 is an equivalent circuit of a coupled dual crystal.

In accordance with the Peppiatt and Roberts patent as well as the publication "A four-frequency process for accurately measuring coupled-dual resonator crystals" by G. E. Roberts, *Proc. 33rd Ann. Symp. on Freq. Contr.*, May, 1979, pp. 159–165, a typical coupled dual resonator crystal is constructed in a manner generally shown in FIGS. 1, 2A and 2B. In its simplest form the structure includes an input (A-side) and an output (B-side) resonator each formed by a pair of thin film electrodes (14 and 22, 16 and 24) deposited on opposite sides of a piezoelectric wafer (12). The electrodes are typically rectangular, circular or semi-circular in shape. Such crystal structure is known to have an equivalent circuit of the nature illustrated in FIG. 3 and as aforementioned is also known to have key parameters such as resonator frequencies and synchronous peak separation frequency. The measurement of such key parameters is necessary for manufacturing such crystal structures in a precise manner. The Peppiatt and Roberts process is the only process known to us from which the critical frequencies can be obtained for the calculation of such key crystal parameters at any step during the fabrication process.

Figure 5A:
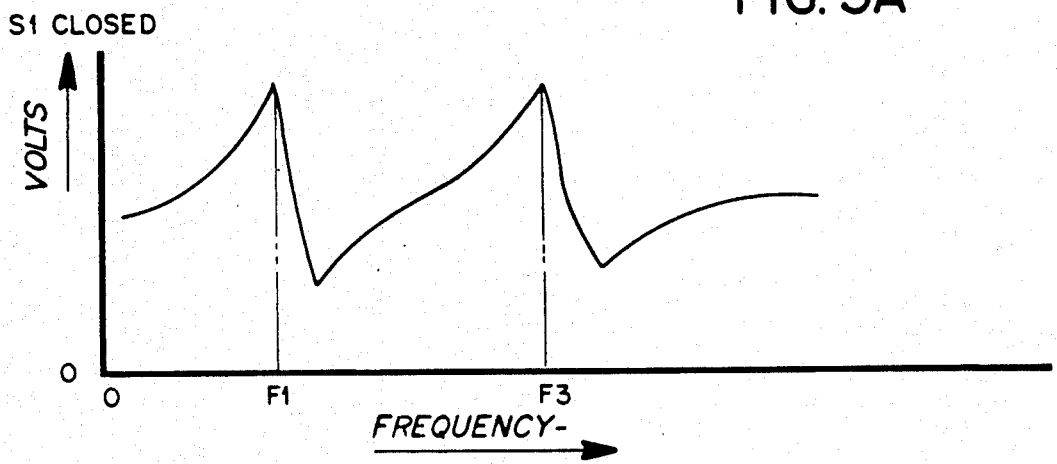
FIGS. 5A, 5B, and 6 are illustrated waveforms helpful to an of the disclosed process.

The Peppiatt and Roberts patent discloses two manners or cases which allow the determination of four critical frequencies useful in calculation of key crystal parameters. In a first instance, as explained in the cited 1979 Roberts publication, two frequencies as illustrated in our FIG. 5A are obtained from the positive non-zero zeros of the numerator polynomial of the A-side driving-point impedance with the B-side short-circuited; whereas, the other two frequencies (FIG. 5B) are obtained from the two positive non-zero zeros of the numerator polynomial of the A-side driving-point impedance with the B-side open-circuited or with a capacitor in parallel with capacitor $C_2$.

Figure 6:
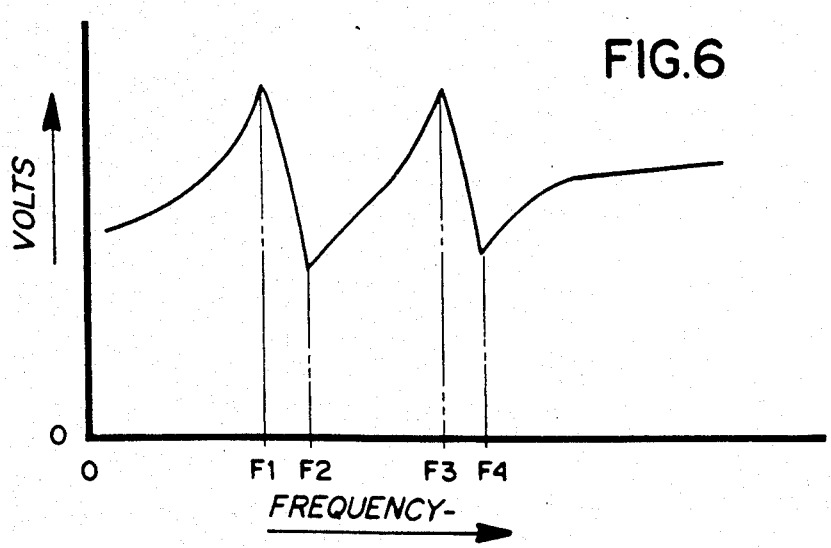

In the second case as illustrated in our FIG. 6, two frequencies are obtained from the two positive non-zero zeros of the numerator polynomial of the A-side driving-point impedance with the B-side short-circuited, and the other two frequencies are obtained from the two positive non-zero zeros of the denominator polynomial of the A-side driving-point impedance with the B-side short-circuited.

Figure 4:
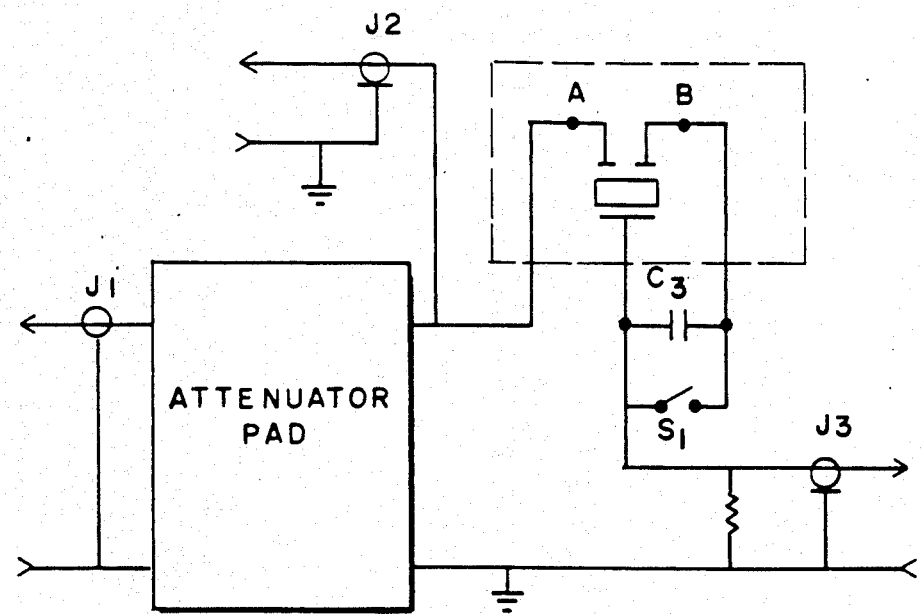
FIG. 4 is a fixture into which the crystal is inserted before the measurement of critical frequencies.
Figure 5B:
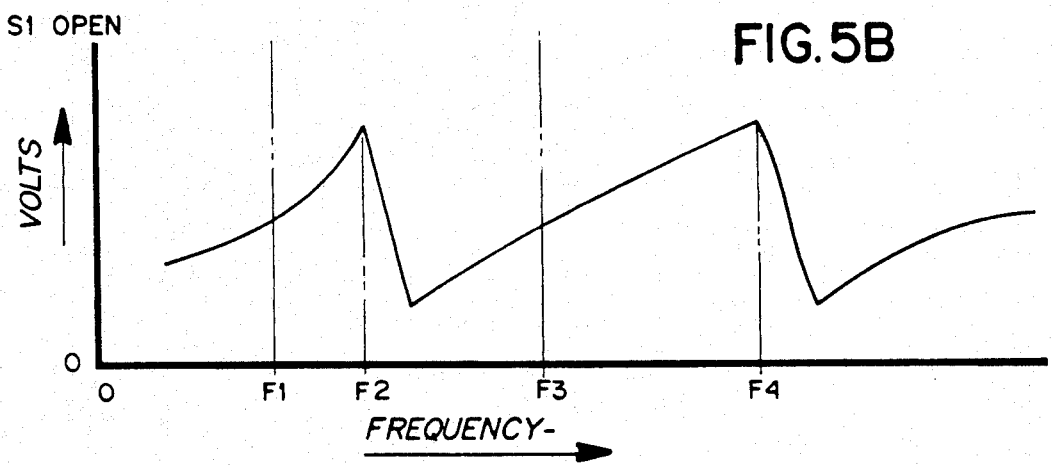

As a practical matter, the frequencies may be measured using a structure of the nature illustrated in FIG. 4 wherein a frequency synthesizer would be connected at J1, and the A and B probes of a vector voltmeter would be connected to J2 and J3, respectively. In the first instance illustrated in our FIG. 5A the frequencies F1 and F3 are determined by sweeping the frequency synthesizer over a range of interest with the switch S1 closed. The frequencies of interest; namely, F1 and F3, will occur when the voltage amplitudes are at or near the two specific maximum amplitudes illustrated and at zero phase. Similarly, the frequencies F2 and F4, as illustrated in FIG. 5B, occur when the synthesizer is swept over the frequency range of interest with switch S1 open and are determined at zero phase in the vicinity of the two specific maximum voltage amplitudes illustrated.

As to the second manner of measuring the critical frequencies as disclosed in the cited patent, the four frequencies illustrated in FIG. 6 may be determined with the frequency synthesizer and vector voltmeter connected as before and the synthesizer caused to sweep over the frequency range of interest with switch S1 closed. Frequencies F1 and F3 are detected at the two relative maximum voltage amplitudes; whereas, frequencies F2 and F4 occur at two specific minimum voltage amplitudes.

Although the values of F2 and F4 in the first measuring instance may or may not have the same values as F2 and F4 obtained in the second instance, as noted in the Peppiatt and Roberts patent, the resulting crystal parameters will be the same. Additionally, it is to be noted that in each measuring process only a single port is monitored. That is to say, as illustrated in FIG. 4, the A-side is monitored with the B-side either short circuited or effectively open circuited with $C_3$ placed in parallel with $C_2$. Subsequent to a determination of the four frequencies, the key crystal parameters may be calculated in the manner disclosed by commonly-assigned Peppiatt and Roberts patent which is hereby incorporated by reference.

As previously noted, both methods of obtaining frequencies F1 through F4 for use in calculating the key crystal parameters monitor only one of the two crystal ports such as the A-side as illustrated in FIG. 4. Such processes offer the advantages of simple and easily calibrated test fixtures wherein only one port need be monitored, and the test procedure is easily automated.

We have discovered, however, a third manner or case of obtaining frequencies F1 through F4 wherein, although both ports require monitoring, this new case produces similar accurate and consistent results to those in the Peppiatt and Roberts patent. In this latter method, two frequencies are obtained from the two positive non-zero zeros of the numerator polynomial of the B-side driving-point impedance with the A-side open-circuited or with a capacitor connected in parallel with $C_1$. The other two frequencies are obtained from the two positive non-zero zeros of the numerator polynomial of the A-side driving-point impedance with the B-side short-circuited.

The first two frequencies are obtained in the manner schematically illustrated in FIG. 4 except that the crystal is inserted in reverse to that which is illustrated: namely, with the A port connected to switch S1. To distinguish these two frequencies obtained by the third case or two-port measuring process, they will hereinafter be designated as F2&40 and F4'. Again the frequency synthesizer is swept over the frequency range of interest, and the frequencies corresponding to F2 and F4 obtained by the one port measuring process of case 1, for example, occur when the B probe of the vector voltmeter indicates zero phase in the vicinity of the two specific maximum voltage amplitudes as illustrated in FIG. 5B. Although the specific values of F2' and F4' in the absence of symmetrical crystals will differ from F2 and F4 obtained previously in the first or second test methods, such values will nevertheless produce the correct key crystal parameters. After measuring the values of F2' and F4', the crystal is removed and inserted as illustrated in FIG. 4 where frequencies F1 and F3 are obtained using the first measuring technique discussed to obtain that which is illustrated in FIG. 5A.

Although this third manner or case of obtaining four zero phase frequencies F1 through F4 requires the monitoring of two ports of the crystal structure, we have discovered that it can be conveniently implemented using a computer controlled vector network analyzer such as a Hewlett-Packard 3577A where twelve term vector error correction can be used in accordance with the previously cited Roberts paper to calibrate out systematic errors of the nature discussed in the publication. As indicated in the above-noted Roberts 1988 publication, such analyzers have been applied for the purpose of measuring crystal parameters and also have been applied to the first case measuring process disclosed in the commonly-assigned Peppiatt and Roberts patent. However, since such analyzers are two port measuring instruments, our third case two port measuring process is more easily and conveniently implemented and produces improved accuracy in evaluating crystal structure parameters.

Figure 7:
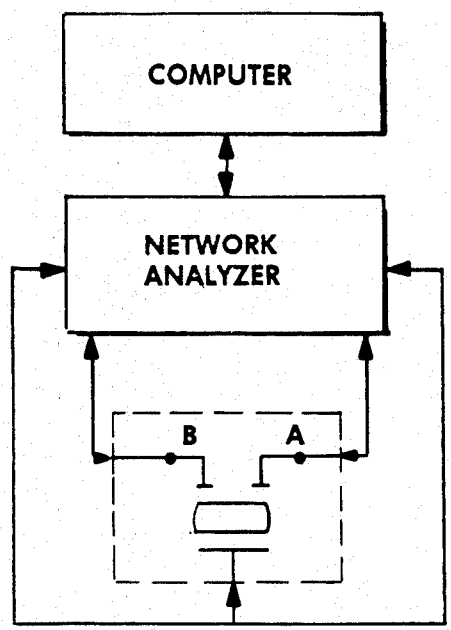
FIG. 7 is a block diagram of a computer controlled network analyzer connected to a coupled dual resonator crystal for the measurement of critical frequencies and the determination of crystal characteristics.
Figure 8:
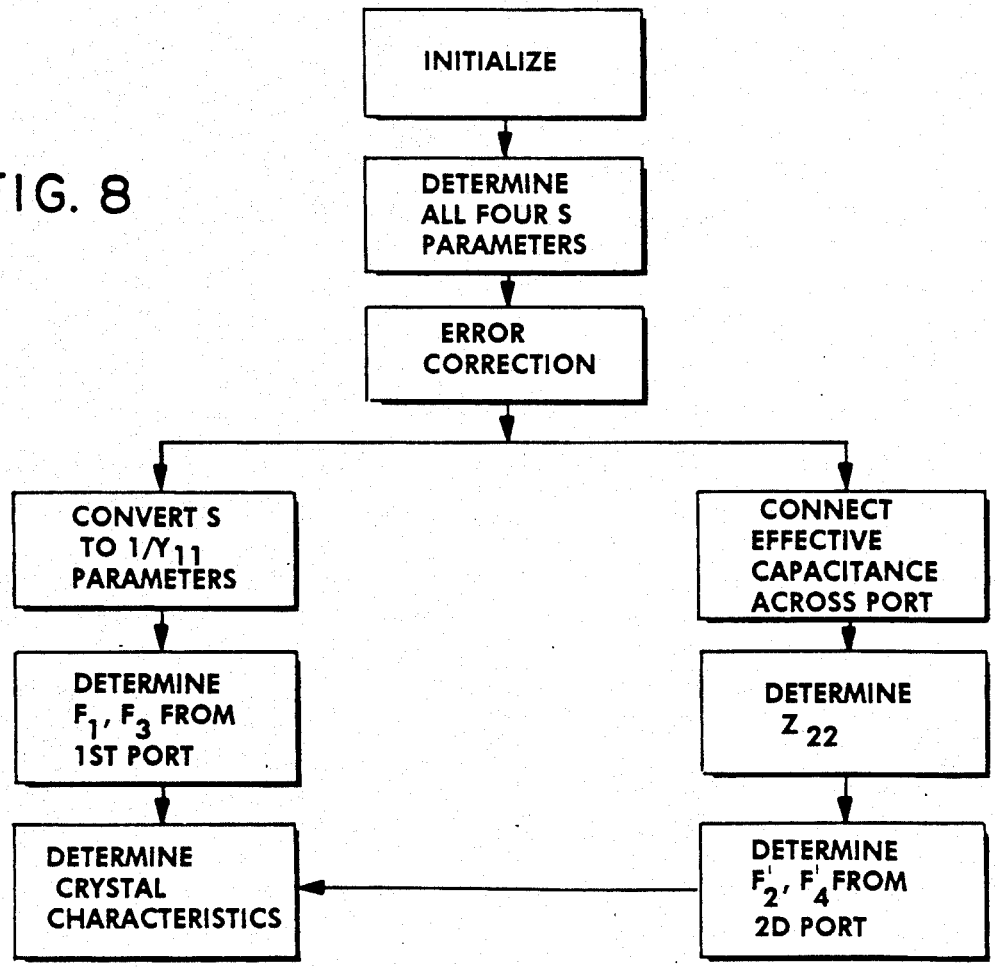
FIG. 8 is a generalized flow chart of the steps followed by the controlled network analyzer in determining critical frequencies and crystal characteristics.

As indicated schematically in FIG. 7, for example, a coupled-dual resonator with input/output ports A and B may be coupled to a computer controlled vector network analyzer, such as the above referenced HP-3577A, wherein the two port measuring instrument measures all four S-parameters. As indicated in the flow chart of FIG. 8, the apparatus is controlled to produce error corrected S-parameters over the appropriate frequency range. The error-corrected S-parameters are converted to Y-parameters and $y_{11}$ is converted to $1/y_{11}$, which is, for example, the B port (as illustrated in FIG. 7), short-circuit driving point impedance which yields F1 and F3 as determined by the zero phase points. However, as distinguished from the aforementioned prior art analyzer apparatus, the analyzer here is configured for determination of critical frequencies F2' and F4' from the opposite or A port (as illustrated in FIG. 7) open-circuit driving point impedance through detection of the zero phase points, rather than determining all four frequencies from one port.

Once frequencies F1 to F4' have been determined, key characteristics of the crystal structure may be determined. In this manner a third case or process is set forth for accurately measuring key crystal parameters at any stage of fabrication after the resonator electrodes are formed.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A method of accurately measuring selected parameters of coupled-dual resonator crystals having a piezoelectric plate, a first input/output electrode on said plate, a common electrode on said plate, and a second input/output electrode on said plate, said method comprising the steps of:

applying a band of frequencies to said first input/output electrode relative to a reference point with the second input/output and the common electrodes open-circuited or connected with a capacitor;

determining the frequencies that cause the maximum voltages to appear at the common electrode relative to said reference point;

applying a band of frequencies to said second input/output electrode relative to said reference point with the first input/output electrode and the common electrode short-circuited; and determining the frequencies that cause the maximum voltages to appear at the common electrode relative to the reference point.

2. The method of claim 1 further comprising the step of:

determining the resonator frequency of each resonator from said frequencies causing the maximum voltages to appear at the common electrode relative to said reference point.

3. The method of claim 2 further comprising the step of:

determining the synchronous peak separation frequency from the resonator frequencies and the frequencies causing the maximum voltages to appear at the common electrode relative to said reference point.

4. A method of accurately determining selected parameters of coupled-dual resonator crystals comprising the steps of:

applying a plurality of swept frequencies to the input of one of the resonators with the output of the other resonator effectively open-circuited;

monitoring the output of said other resonator for zero phase output signals;

determining the frequencies which cause the maximum output voltages to occur at or near the zero phase output signals;

applying a plurality of swept frequencies to the input of said other resonator with the output of said one resonator short-circuited;

monitoring the output of said one resonator for zero phase output signals; and determining the frequencies which cause the maximum output voltages to occur at or near the zero phase output signals.

5. The method of claim 4 further comprising the step of:

determining key crystal parameters including the resonator frequency of each of the resonators and the synchronous peak separation frequency, from said frequencies causing the maximum output voltages;

said determining steps occurring at any time in a crystal fabrication process after the formation of said resonators.

6. The method of claim 4 further comprising the step of:

determining the resonator frequency of each resonator from the frequency causing said maximum output voltages.

7. The method of claim 6 further comprising the step of:

determining the synchronous peak separation frequency from the resonator frequencies and the frequencies causing said maximum voltage outputs.

8. A method of accurately measuring selected parameters of coupled-dual resonator crystals having a piezoelectric plate, a first electrode on said plate, a common electrode on said plate and a second electrode on said plate, said method comprising the steps of:

connecting a capacitor between the second and common electrodes;

applying a variable frequency signal to the first electrode relative to a reference point;

monitoring said common electrode relative to said reference point for zero phase output signals;

determining the frequencies which cause the maximum output voltages to occur at or near the zero phase output signals;

disconnecting said capacitor and applying a variable frequency signal to said second electrode relative to said reference point with said first and common electrodes short-circuited;

monitoring said common electrode relative to said reference point for zero phase output signals; and determining the frequencies which cause the maximum output voltages to occur at or near the zero phase output signals.

9. The method of claim 8 further comprising the step of:

determining key crystal parameters including the resonator frequency of each of the resonators and the synchronous peak separation frequency, from said frequencies causing the maximum output voltages;

said determining steps occurring at any time in a crystal fabrication process after the formation of said resonators.

10. A method for accurately determining the value of at least one predetermined characteristic of a coupled-dual resonator crystal having input/output ports A and B by measuring frequency parameters F1, F2', F3 and F4' used in determining said characteristic, said method comprising the steps of:

measuring frequency parameters F2' and F4' from the driving point impedance of port A of said coupled dual crystal;

measuring frequency parameters F1 and F3 from the driving point impedance of port B of said coupled-dual crystal; and determining the value of said characteristic based on said measured frequency parameters.

11. A method as in claim 10, wherein said determining step includes determining the resonator frequencies of the dual resonators.

12. A method as in claim 10 wherein said determining step includes determining the SPSF of said coupled-dual resonator crystal.

13. An apparatus for accurately determining the value of at least one predetermined characteristic of a coupled-dual resonator crystal having input/output ports A and B by measuring frequency parameters F1, F2', F3 and F', which are used in determining said characteristic, said apparatus comprising:

a computer controlled analyzer including, means for measuring frequency parameters F2' and F4' from the driving point impedance of port A of said coupled-dual crystal, means for measuring frequency parameters F1 and F3 from the driving point impedance of port B of said coupled-dual crystal, and means for determining the value of said characteristic based on said measured frequency parameters.

14. An apparatus as in claim 13 wherein the determining means determine the SPSF characteristic of said coupled-dual resonator crystal.

15. An apparatus as in claim 13 wherein the determining means determines the resonant frequencies of said dual resonators.

* * * * *